(12) United States Patent
Yang et al.

(10) Patent No.: US 7,335,870 B1
(45) Date of Patent: Feb. 26, 2008

(54) METHOD FOR IMAGE SENSOR PROTECTION

(75) Inventors: Wen-Kun Yang, Hsinchu (TW); Jui-Hsien Chang, Jhudong Township, Hsinchu County (TW); Hsien-Wen Hsu, Lujhou (TW)

(73) Assignee: Advanced Chip Engineering Technology Inc., Hsinchu County (TW)

( * ) Notice: Subject to any disclaimer, the term of this patent is extended or adjusted under 35 U.S.C. 154(b) by 0 days.

(21) Appl. No.: 11/539,215

(22) Filed: Oct. 6, 2006

(51) Int. Cl.
*H01L 21/00* (2006.01)
*H01L 27/00* (2006.01)

(52) U.S. Cl. .................................. 250/208.1; 438/64
(58) Field of Classification Search ............. 250/208.1, 250/214.1; 438/64–69, 71, 73, 110, 116; 257/432–434
See application file for complete search history.

(56) References Cited

U.S. PATENT DOCUMENTS

| | | | |
|---|---|---|---|
| 5,514,888 A | 5/1996 | Sano et al. | 257/232 |
| 6,624,404 B2 * | 9/2003 | Lee et al. | 250/208.1 |
| 6,638,782 B2 * | 10/2003 | Izumi et al. | 438/30 |
| 2007/0010041 A1 * | 1/2007 | Kang et al. | 438/64 |

\* cited by examiner

*Primary Examiner*—Kevin Pyo
(74) *Attorney, Agent, or Firm*—Kusner & Jaffe

(57) ABSTRACT

The method of forming image sensor protection comprises attaching a glass on a tape and scribing the glass with lines to define cover zones on the glass, the glass is then break by a rubber puncher followed by forming glue on the edge of the cover zones. The glass is bonded on a wafer with an image sensor to align the cover zones to a micron lens area of the image sensor, and then the tape is removed from the wafer, thereby forming glass with cover zones on the image sensor.

8 Claims, 2 Drawing Sheets

METHOD FOR IMAGE SENSOR PROTECTION

FIELD OF THE INVENTION

This invention relates to a CMOS image sensor (CIS), and more particularly to a protection method for the manufacture of an image sensor.

BACKGROUND OF THE INVENTION

Description of the Prior Art

Most digital cameras include an image sensor or a photosensitive device, such as Complementary Metal-Oxide Semiconductor (CMOS) device to sense a scene. The photosensitive device reacts to light reflected from the scene the strength of that reaction into electronic charging signals. The camera can determine the specific color of each segment of the picture. Because the image is actually a collection of numeric data, it can easily be manipulated for more other effects. A digital image technique has been wildly applied to image shooting instrument such as digital camera, image scanner, etc. The conventional CMOS sensor is disposed on a circuit board. The CMOS sensor has a die secured therein. The lens seat has a focusing lens for focusing the image onto the die of the CMOS sensor. Through the lens, the image signal is sent by the die to a digital processor for converting the analog signal into digital signal.

In conventional digital imaging applications, an image sensor is coupled to an imaging processing chip for processing the captured image. The image sensor can be a charged-coupled device (CCD) or a Complementary Metal-Oxide Semiconductor (CMOS) sensor, communicates with image processing unit via a pixel data bus. Conventional image sensors provide either digital pixel data or analog pixel values as output signals on the pixel data bus.

The sensor array is typically packaged to prevent from being damage by external force. The packages have a core made of a common material such as glass epoxy, and have additional layers laminated onto the core. These additional layers are also known as "built-up" layers. The built-up layers are typically formed from alternating layers of dielectric material and conductive material. Patterns may be built in the metal or conductive layer through various etching processes such as wet etching which are known in the art and will not be described further herein. Plated through holes called vias are used to make interconnects between various layers of metal. Using these layers and vias, several layers of interconnections may be built up. Input/Output functions are typically accomplished using metal traces between the layers. The traces may be routed over or under the layers.

The die of the CMOS sensor is relatively sensitive to infrared ray and dust particles. If the unwanted particles are not removed from the sensor, it leads to downgrade the quality of the device. In order to achieve the purpose, the removal by manual may damage the sensitive chip. Typically, the image sensor module is formed by using a method of COB or LCC. One drawback of the COB is lower yield rate during packaging process due to particle contamination on sensing area. Besides, the drawbacks of the LCC are higher packaging cost and lower yield rate due to particle contamination on sensing area.

Further, micro lenses are optical components on semiconductors utilized as solid state imaging devices. One of the most important considerations in designing and manufacturing micro lenses is photosensitivity. One reason micro lens photosensitivity may be reduced is that the area of each micro lens has been reduced below an optimum value. U.S. Pat. No. 5,514,888 for ON-DIE SCREEN TYPE SOLID STATE IMAGE SENSOR AND MANUFACTURING METHOD THEREOF; issued May 7, 1996 to Yoshikazu Sano, et al. teaches a method for forming charge-coupled devices (CCDS) on a silicon substrate. A micro lens array is formed over the CCD array using conventional lithography and reflow techniques.

In view of the aforementioned, the present invention provides an improved package by a protection method to overcome the drawbacks.

SUMMARY OF THE INVENTION

Therefore, the main objective of the present invention is to provide a protection method for image sensor, such as COB (Chip On Board) or FBGA (Fine-pitch Ball Grid Array) package structure, to prevent the sensor from particle contamination on micro lens.

The yet objective of the present invention is to provide a CMOS image sensor protection method without the usage of lithography process.

The method of forming image sensor protection comprises attaching a glass on a tape and scribing the glass with lines to define cover zones on the glass; breaking the glass by a rubber puncher followed by forming glue on the edge of the cover zones; bonding the glass on a wafer with an image sensor to align the cover zones to a micron lens area of the image sensor; curing the glue, and then removing the tape from the wafer, thereby forming glass with cover zones on the image sensor; and separating the image sensors.

The lines are constructed by vertical lines and horizontal lines, thereby forming a checkerboard pattern to define the cover zone.

BRIEF DESCRIPTION OF THE DRAWINGS

The above objects, and other features and advantages of the present invention will become more apparent after reading the following detailed description when taken in conjunction with the drawings, in which.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims. Then, the components of the different elements are not shown to scale. Some dimensions of the related components are exaggerated and meaningless portions are not drawn to provide clearer description and comprehension of the present invention. The structure is adaptable to the FBGA (Fine-pitch Ball Grid Array) and COB (Chip On Board) type package. The present invention benefits lower cost and more simple process than the die scale package (CSP). The CSP type package suffers higher cost issue. Further, data processing speed of the FBGA package is far faster than conventional TSOP (Thin Small Outline Package) for interconnection wires design.

Figure 1:
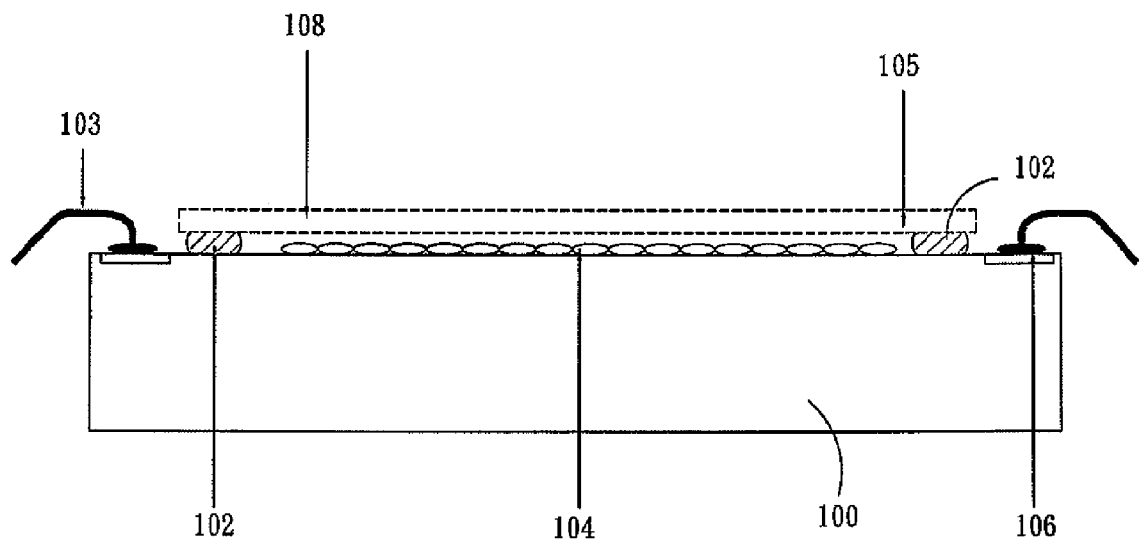
FIG. 1 is a schematic diagram of a image sensor according to the present invention.

The processed wafer bears a plurality of dice having devices formed therein. In one example, the devices include image sensors formed thereon. The image sensor includes CCD or CMOS sensor. An adhesive film pattern 102 is formed on a substrate 100, shown as FIG. 1. The material of the adhesive film pattern 102 is elastic material, such as UV type or thermal type material. In one embodiment, the elastic material comprises BCB, SINR (Siloxane polymer), epoxy, polyimides or resin. Besides, the elastic film pattern 102 may be formed by printing, coating or tapping method. The substrate 100 comprises silicon, glass, ceramic or quartz. Then, the chip-side (or device side) of the wafer is attached to elastic film pattern 102 to expose bonding pads 106, such as Al pads, the wire 103 is used to connect the external pads to transfer electrical signal for, for instance, the Chip On Board application, as shown in FIG. 1. Therefore, a micro lens area 104 of the image sensor is covered by the glass 108. A micro lens is generally formed on the top surfaces of image sensor. The edge of the die may be contacted with the elastic film pattern 102. Al pads 106 do not contact with the elastic film pattern 102. A color filter layer is next formed over an isolation layer with sub-pixel areas properly aligned with active devices in the wafer 100. There are several ways well known to those skilled in the art to proceed with the formation of a micro lens. One material found suitable for the micro lens is a mixture of melamine resin and generic novolac base resin.

The present invention provides an alternatively method to form the protection glass without the usage of the lithography process.

The method that involves the lithography is briefly mentioned below. A photoresist (PR) is patterned on the glass to expose the area not aligned to the image sensor area or micron lens area 104. The glass is then etched by a wet etching process to remove partial glass exposed by the PR, thereby exposing Al pads 106 and the partial silicon die. For example, the wet etching solution is HF or BOE, etc. PR is then stripped. The micro lens area 104 is protected by the glass 101 from particle contamination.

The wafer is divided to obtain a plurality of an individual CMOS or CCD image sensor die. From the individual package structure, micro lenses are formed on the top surfaces of the die, the edge of the divided glass contacts to the elastic film pattern 102. Contact pads are located at the edge of the die without contacting with the elastic film pattern. An air gap 105 is created between the die and the glass and over the micron lens area.

Figure 2:
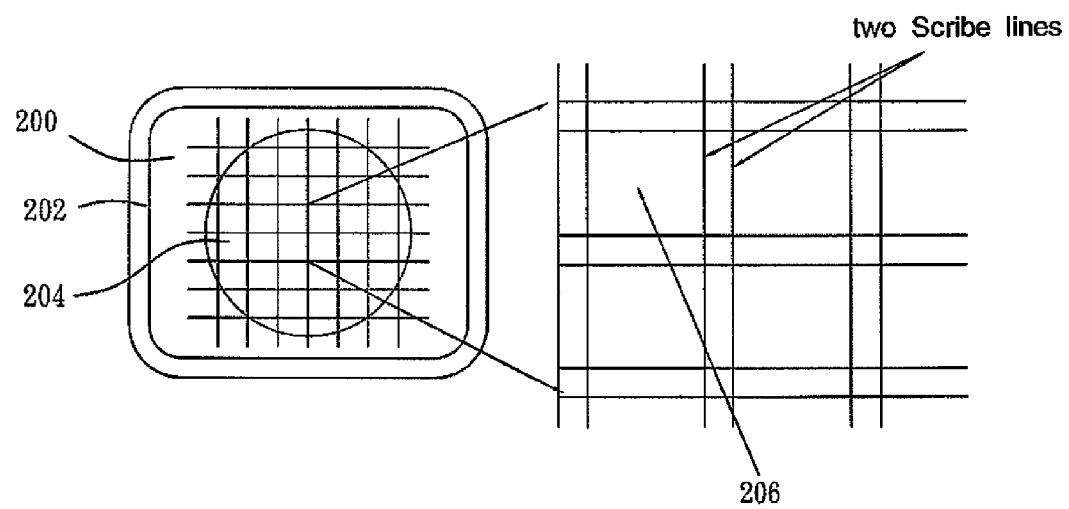
FIG. 2 is a schematic diagram showing a glass attached on a tape according to the present invention.
Figure 3:
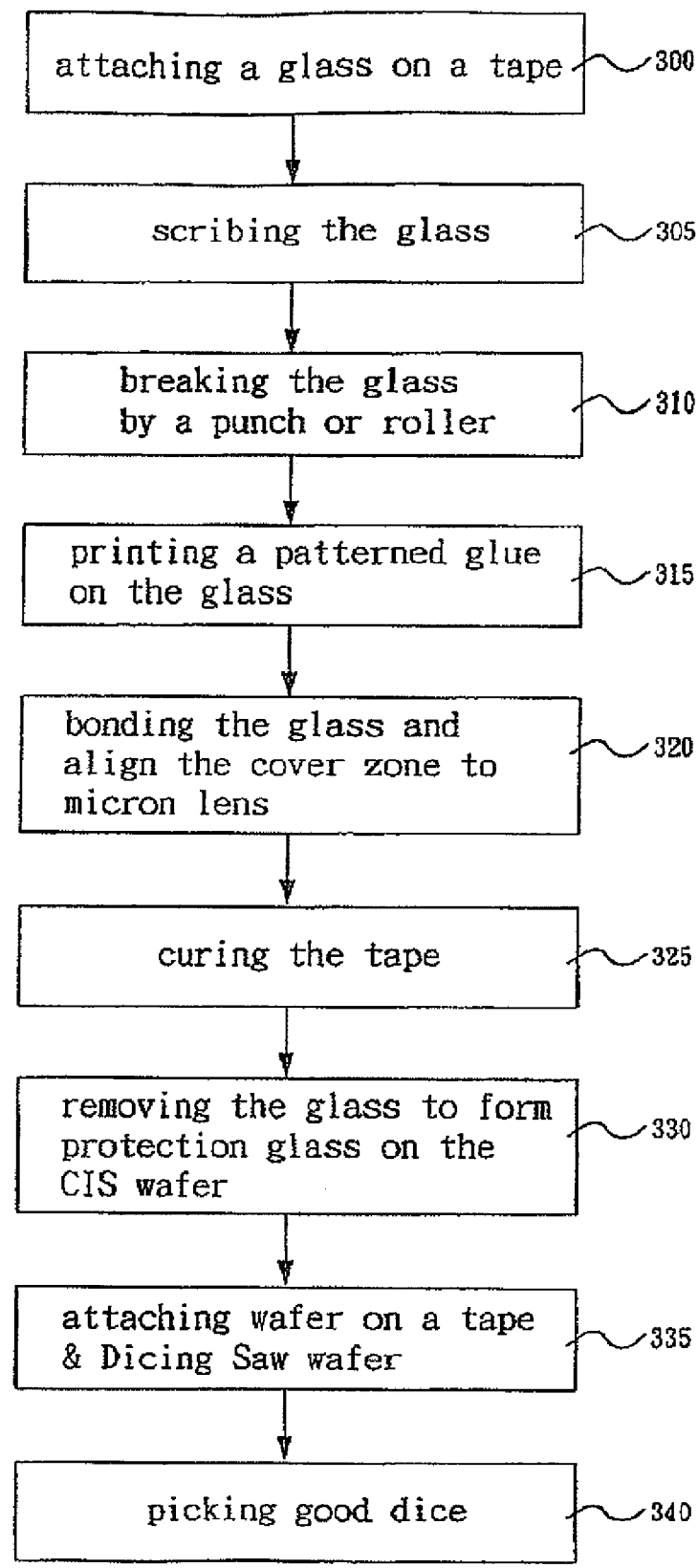
FIG. 3 is flow chart according to the present invention.

The present invention provides an alternatively method to form the protection glass without the usage of the lithography process. Referring to FIG. 2 and FIG. 3, a glass is attached on a tape 200, such as UV tape, with a frame 202, in step 300 of FIG. 3. The glass 204 may be a round type or rectangular type. The glass is optionally coated with IR coating and the thickness of the coating is around 50-200 micron meters.

In step 305 of FIG. 3, the next step is to scribe the glass 204 with two lines on the glass, as shown in FIG. 2. The scribe lines that are constructed by vertical lines and horizontal lines form a checkerboard pattern, thereby forming cover zones 206 divided by each two-parallel lines. Each boundary is constructed by two vertical or horizontal lines.

The next step 310 is to break the glass by a rubber punch. Subsequently, in step 315, the glue, such as UV glue, is printed or coated on the around edge of cover zones 206. The wide of the glue is around 80-120 micron meters, and the thickness is approximately 20-40 micron meters.

Then, the glass is processed by the panel bonder with around 50 micron meters accuracy alignment to bond the glass, and align the cover zone on the top of the micron lens to make sure the glue not to attach the lens area. Preferably, the process is performed by vacuum bonding, therefore, no air gap will be generated, please refer to step 320.

Next step 325 is to cure the tape and to make sure that the glass surface is flatness. If the tape is UV tape, the UV curing will be employed accordingly. Subsequently, the UV tape is removed from the chip and the rest glass is also removed, thereby forming the protection glass on the CIS wafer due to the glass is divided by previous punching, referring to step 330.

Next step 335 is to attach the wafer on a tape and then to separate the dice from the wafer, followed by picking up the good CIS dice on the PCB board or substrate for COB or BOA application in step 340.

In an individual COB (Chip On Board) package module, a glass is attached on the top surfaces of a die through the elastic film pattern to expose Al pads for wire bonding. Al pads are connected to the connection pads of a printed circuit board through a plurality of bonding wires, respectively. Then, a protection material is substantially covered the pluralities of the bonding wires, Al pads and the connection pads except the top of the glass to allow the light to pass through. In one embodiment, the protection material comprises compound, liquid compound, and the protection material may be formed by molding or gluing method. As the same, a micro lens may be formed on the micro lens area. A lens holder maybe is fixed on the printed circuit board to hold a lens. A filter, such as an IR CART, is fixed to the lens holder. Alternatively, the filter may comprise a filtering layer, for example IR filtering layer, formed upper or lower surface of the glass to act as a filter. In one embodiment IR filtering layer comprises $TiO_2$, light catalyzer. The glass may prevent the micro lens from particle containment. The user may use liquid or air flush to remove the particles on the glass without damaging the micron lens.

Hence, according to the present invention, the aforementioned package structure has the advantages list as follow: the FBGA or COB package structure of the present invention can prevent the micro lens from particle contamination. Moreover, CMOS/CCD image sensor package module structure may be directly cleaned to remove particle contamination. The process of manufacturing of the FBGA or COB package structure of the present invention is significantly simple.

Although specific embodiments have been illustrated and described, it will be obvious to those skilled in the art that various modifications may be made without departing from what is intended to be limited solely by the appended claims.

Having described the invention, the following is claimed:

1. A method of forming image sensor protection, comprising:
   attaching a glass on a tape;
   scribing said glass with lines to define cover zones on said glass;
   breaking said glass by a puncher;
   forming glue on the edge of said cover zones;

bonding said glass on a wafer with an image sensor to align said cover zones to a micron lens area of said image sensor;

curing said glue;

removing said tape from said wafer, thereby forming glass with cover zones on said image sensor; and separating said image sensors.

2. The method in claim 1, further comprising picking good image sensor to a substrate or PCB for further application.

3. The structure in claim 1, wherein said tape is UV tape.

4. The structure in claim 1, wherein said tape has a frame.

5. The structure in claim 1, wherein glue is a UV glue.

6. The structure in claim 1, wherein said lines are constructed by vertical lines and horizontal lines, thereby forming a checkerboard pattern.

7. The structure in claim 1, wherein said puncher is a rubber puncher.

8. The structure in claim 1, wherein said glass is bonded by a panel bonder with accuracy alignment.

* * * * *